United States Patent
Behera et al.

(10) Patent No.: US 8,422,975 B2
(45) Date of Patent: Apr. 16, 2013

(54) HARMONIC SUPPRESSION AND/OR REJECTION

(75) Inventors: Manas Behera, Austin, TX (US); Junxiong Deng, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 342 days.

(21) Appl. No.: 12/797,454

(22) Filed: Jun. 9, 2010

(65) Prior Publication Data
US 2011/0306300 A1 Dec. 15, 2011

(51) Int. Cl.
*H04B 1/10* (2006.01)
*H04B 1/04* (2006.01)

(52) U.S. Cl.
USPC ........ 455/296; 455/317; 455/310; 455/114.1; 455/323; 455/76

(58) Field of Classification Search ........ 455/114.1, 455/295, 296, 315, 317, 318, 323
See application file for complete search history.

(56) References Cited

U.S. PATENT DOCUMENTS

| | | | | |
|---|---|---|---|---|
| 6,728,525 B1* | 4/2004 | Leizerovich et al. | ......... | 455/260 |
| 7,509,110 B2* | 3/2009 | Hayashi et al. | ................ | 455/302 |
| 7,519,348 B2* | 4/2009 | Shah | .............................. | 455/285 |
| 7,598,815 B2* | 10/2009 | Chen et al. | ........................ | 331/16 |
| 8,165,538 B2* | 4/2012 | Pullela et al. | ................ | 455/114.1 |
| 2006/0040634 A1* | 2/2006 | Wang | .............................. | 455/313 |
| 2006/0205370 A1 | 9/2006 | Hayashi et al. | | |
| 2007/0008429 A1* | 1/2007 | Cha et al. | ........................ | 348/528 |
| 2008/0194222 A1* | 8/2008 | Liu et al. | ........................ | 455/296 |
| 2009/0004994 A1* | 1/2009 | Rafi et al. | ........................ | 455/323 |
| 2011/0268163 A1* | 11/2011 | Fillatre et al. | .................. | 375/219 |

OTHER PUBLICATIONS

International Search Report and Written Opinion—PCT/US2011/039810, ISA/EPO—Sep. 6, 2011.
Moseley N A et al., "A Two-Stage Approach to Harmonic Rejection Mixing Using Blind Interference Cancellation", IEEE Transactions on Circuits and Systems II: Express Briefs, IEEE, US, vol. 55, No. 10, Oct. 1, 2008, pp. 966-970, XP011236580, ISSN: 1549-7747, DOI: 10.1109/TCSII.2008.926796.
Weldon, J. et al. (Dec. 2001) A 1.75-GHz Highly Integrated Narrow-Band CMOS Transmitter With Harmonic-Rejection Mixers, IEEE, vol. 36, No. 12, pp. 2003-2015.

* cited by examiner

*Primary Examiner* — Duc M Nguyen
(74) *Attorney, Agent, or Firm* — Ramin Mobarhan

(57) ABSTRACT

Disclosed are circuits, techniques and methods for removing one or more harmonics from a waveform that has been mixed with a local oscillator. In one particular example, such a waveform may also be mixed with a second local oscillator at a different frequency and combined with the first mixed waveform to suppress and/or substantially remove the one or more harmonics.

23 Claims, 3 Drawing Sheets

HARMONIC SUPPRESSION AND/OR REJECTION

BACKGROUND

In today's integrated radio frequency (RF) transceivers, stages in the upconversion and downconversion of signals typically introduces unwanted harmonics. In upconverting a baseband signal for transmission at RF, a baseband filter and mixer typically introduce unwanted harmonics into the upconverted signal. Such unwanted harmonics typically degrades adjacent channel leakage ratio (ACLR) performance of a transmitter and/or introduces in-band distortion, for example.

Techniques to reject unwanted harmonics have typically included implementation of a three-phase harmonic rejection mixer (HRM). For the upconversion of a baseband waveform for RF transmission, for example, a HRM typically mixes the baseband waveform with three different local oscillator (LO) signals, and combines the resulting mixed signals to remove unwanted harmonics. Such a technique would typically be implemented in circuitry using three mixers and three phasors for mixing the baseband waveform. As such, this particular technique impacts power consumption and silicon (e.g., CMOS) processing requirements (e.g., for implementation of RF devices in CMOS).

SUMMARY

One particular implementation is directed to a method and/or circuit for processing a waveform component so as to substantially remove at least a portion of unwanted harmonics. Here, a waveform component may be mixed with a first oscillation signal at a frequency $f_{LO}$ to provide a first output signal where the first output signal comprises an nth order harmonic. The waveform component may also be mixed with a second oscillation signal at about an n multiple of frequency $f_{LO}$ to provide a second output signal. The first and second output signals may then be combined to remove at least a portion of the nth order harmonic from said first output signal. It should be understood, however, that this is merely an example implementation, and that claimed subject matter is not limited in this respect.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments and is not intended to represent the only embodiments covered by claimed subject matter. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that exemplary embodiments of may be practiced without these specific details. In some instances, well known structures and devices are shown in block diagram form in order to avoid obscuring the novelty of exemplary embodiments presented herein.

As pointed out above, techniques for rejecting unwanted harmonics in signals have typically involved mixing a waveform component with three oscillating signals, and combining the mixed signals to remove at least a portion of the unwanted harmonics. In a particular implementation, as discussed in greater detail below, a waveform component may be mixed at a local oscillation frequency to provide a first output signal where the first output signal comprises an nth order harmonic. The waveform component may also be mixed at an n multiple local oscillation frequency to provide a second output signal. The first and second output signals may then be combined to remove at least a portion of the nth order harmonic from said first output signal. As discussed below in more detail, this particular technique may allow for achieving harmonic rejection and/or suppression with a reduction in mixers and phasors to conserve power and silicon processing resources. It should also be understood, however, that this is merely an example implementation, and that claimed subject matter is not limited in this respect.

Figure 1:
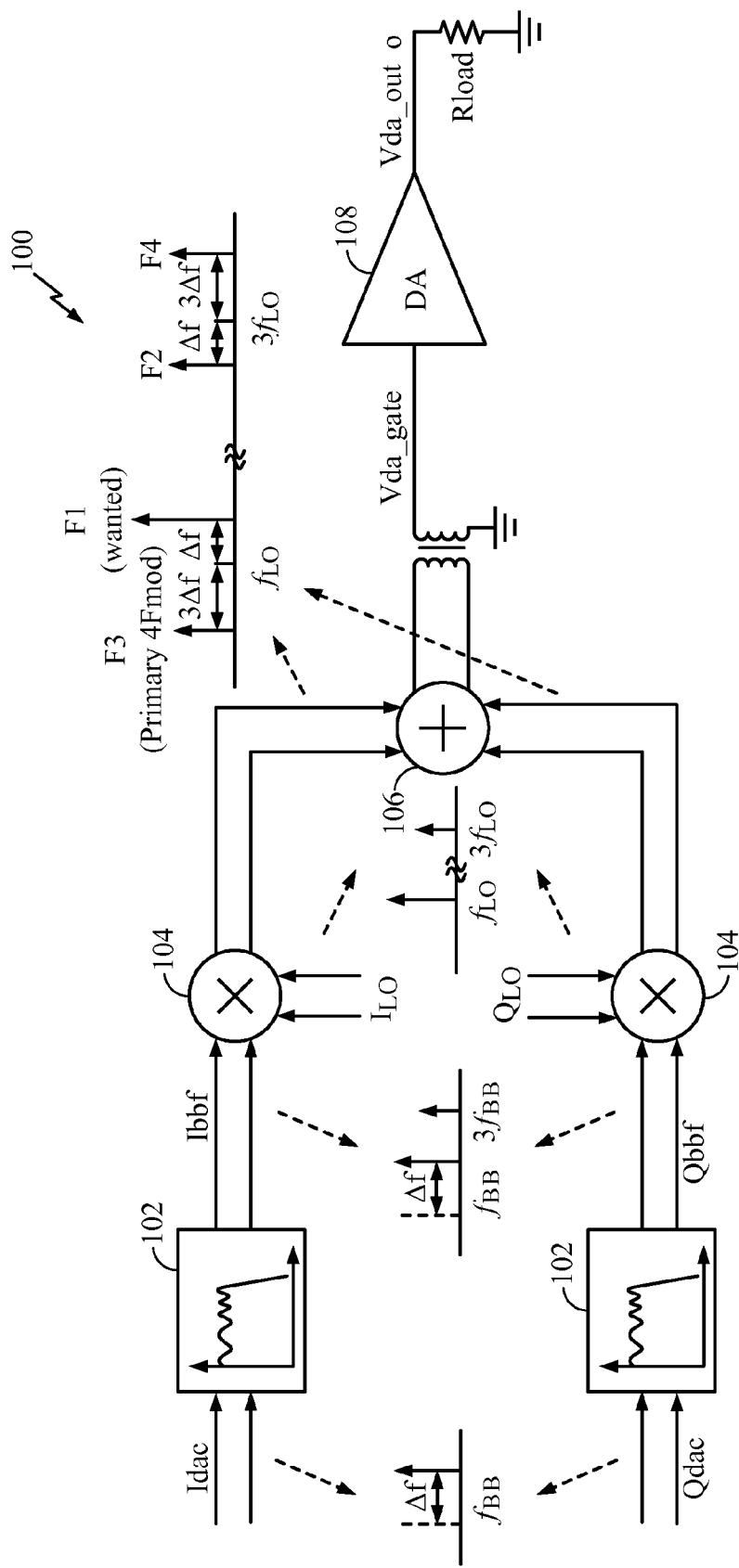
FIG. 1 is a schematic diagram of a circuit for processing a baseband signal for radio frequency (RF) transmission according to an implementation.

FIG. 1 is a schematic diagram of a circuit for processing a baseband signal for radio frequency (RF) transmission according to an implementation. While the particular examples presented herein are directed to processing a baseband signal for RF transmission, it should be understood that other implementations may be applied to processing received RF signals to recover baseband signals without deviating from claimed subject matter. For example, particular embodiments may be directed to removing harmonics from waveform components which are mixed with a local oscillator for downconversion. Additionally, particular applications may include the processing of baseband signals modulated with any of several types of information including, for example, voice, data, images, etc., without deviating from claimed subject matter. As such, particular implementations may be applied to transmitters and/or receivers in any one of several device platforms such as, for example, cell phone, personal digital assistant (PDA), laptop computer, base station transceiver, etc., just to name a few examples.

In this particular implementation, baseband waveform components Idac and Qdac may comprise in-phase and quadrature components of a baseband signal where the baseband signal is to be upconverted for transmission over a transmission medium (e.g., air interface, twisted pair cables, coaxial cables, fiber optic cables, etc.). In one particular example implementation, in-phase and quadrature components Idac and Qdac may be provided in digital form. FIG. 1 shows in-phase and quadrature components Idac and Qdac as differential signals in a particular implementation However, claimed subject matter is not limited in this respect. Alternatively, for example, waveform components Idac and Qdac may be generated based, at least in part, on a digital-to-analog conversion (not shown) of a digital baseband signal. In this context, "waveform component" as used herein relates to any signal energy which transmits information according to a particular signaling format. Additionally, a waveform component as used herein may relate to a signal in either analog or digital form. While the particular examples herein are directed to application of processing in-phase and quadrature components of a baseband signal, it should be understood that particular techniques described herein may be applied to different types of waveform components without deviating from claimed subject matter.

Here, a baseband signal is shown as having a center baseband frequency of $f_{BB}$ or $\Delta f$ from an origin. As shown in FIG. 1, baseband filters 102 may reject noise and unwanted modulation components to isolate the baseband signal BB for upconversion to an RF frequency at mixers 104. In a particular implementation, in-phase and quadrature components $I_{LO}$ and $Q_{LO}$ may be generated as square wave signals having a primary oscillation frequency of $f_{LO}$. As such, in addition to having a spectral component at $f_{LO}$, $I_{LO}$ and $Q_{LO}$ may have higher order harmonics such as nth order harmonics where n is an odd integer. Mixing $I_{LO}$ or $Q_{LO}$ with a baseband signal may provide output signals having a frequency of around $f_{LO}$ as well as around $n \times f_{LO}$ (e.g., an nth order harmonic). In the particular example, of FIG. 1, n=3. It should be understood, however, that this is merely an example of a particular nth order of harmonic that may originate from a local oscillation signal to be mixed with a baseband signal, and that nth order harmonics may comprise different harmonics where n is an integer other than three.

As used herein an "nth order harmonic" refers to a presence of signal energy at, about and/or centered at a frequency that is spectrally separated from an origin by n times a reference frequency. In one particular example, as pointed out above, $I_{LO}$ and $Q_{LO}$ have one or more harmonic components at frequencies that are an integer multiple (e.g., n multiple) of $f_{LO}$ from the origin to provide an nth order harmonic. Of course, this is merely an example of an nth order harmonic, and claimed subject matter is not limited in this respect.

Mixers 104 combine mix filtered baseband signals $I_{BBF}$ and $Q_{BBF}$ with local oscillators $I_{LO}$ and $Q_{LO}$ at a local oscillation frequency $f_{LO}$, and 90 degrees out of phase from one another, to provide in-phase and quadrature components of baseband signal BB shifted in frequency by $f_{LO}$ to F1=$f_{LO}$+/-$f_{BB}$. Additionally, nth order harmonics generated at BB filters 102 at frequencies are also mixed with phasors $I_{LO}$ and $Q_{LO}$ at a local oscillation frequency $f_{LO}$ to provide harmonics at F2=$n \times f_{LO}$+/-$f_{BB}$, F3=$f_{LO}$+/-$n \times f_{BB}$, and F4=$n \times f_{LO}$+/-$n \times f_{BB}$. In the particular example of FIG. 1, n is shown as three. Again, however, n may be any integer and claimed subject matter is not limited in this respect. Components provided by mixers 104 at frequencies F1, F2, F3 and F4 may then be combined at summer 104 to provide a combined upconverted output signal. The combined upconverted output signal may then be amplified for transmission at driver amplifier (DA) 108 for transmission over a transmission medium.

In a particular implementation, DA 108 may have some non-linearities (e.g., a third order non-linearity) that may cause components of the combined upconverted output signal at frequencies F1, F2, F3, and F4 to intermodulate. Such intermodulation of these components may introduce in-band distortion in the amplified and transmitted signal. In the particular example, illustrated in FIG. 1, F1 may substantially include a signal for transmission at desired frequencies $f_{LO}$+/-$f_{BB}$ modulated by information in a baseband signal while F2, F3 and F4 substantially include unwanted signal components. Here, all or portions of F2, F3, and F4 may comprise nth order harmonics. In order to mitigate in-band distortion arising from intermodulation of components at frequencies F1, F2, F3, and F4, in a particular implementation, all or portions of such nth order harmonics may be removed and/or suppressed.

As discussed above, and in a particular example implementation, LO signal $I_{LO}$ or $Q_{LO}$ may be generated or modeled as a square wave function. As such, LO signal $I_{LO}$ or $Q_{LO}$ may be expressed in the frequency domain $\omega=2\pi f$ as shown in expression (1) as follows:

$$Sq(\omega)=(2/\pi)*[\cos(\omega t)-\tfrac{1}{3}*\cos(3\omega t)+\tfrac{1}{5}*\cos(5\omega t)+\ldots+1/k*\cos(k\omega t)] \quad (1)$$

In this particular example, terms "$-\tfrac{1}{3}*\cos(3\omega t)$" and "$\tfrac{1}{5}*\cos(5\omega t)$" in expression (1) are a result of third and fifth order harmonics. Here, can be seen that reduction or removal of the term "$-\tfrac{1}{3}*\cos(3\omega t)$" would substantially or completely remove the third order harmonic. In a particular implementation of FIG. 1, in addition to being mixed with a frequency component at $f_{LO}$, a filtered BB signal $I_{BBF}$ or $Q_{BBF}$ is also mixed at frequency components of the third and fifth harmonics of $f_{LO}$. to provide a first output signal. $I_{BBF}$ or $Q_{BBF}$ may also be mixed with a second oscillation signal at a different LO frequency $n \times f_{LO}$ (e.g., $3 \times f_{LO}$ in the presently illustrated example) to generate a second output signal. Here, the second output signal may be combined with the first output signal for suppression or removal of nth order harmonics arising from the term $1/n*\cos(n\omega t)$ (e.g., "$-\tfrac{1}{3}*\cos(3\omega t)$"). Here, such a second oscillation signal may be may be expressed in the frequency domain $\omega=2\pi f$ as shown in expression (2) as follows:

$$Sq(n\omega)=(2/\pi)*[\cos(n\omega t)-\tfrac{1}{3}*\cos(n\omega t)+\tfrac{1}{5}*\cos(5\omega t)+\ldots] \quad (2)$$

Here, by adding or subtracting $1/nS(n\omega)$ to both sides of expression (1), the nth harmonic term may be substantially removed. In the particular example where n=3, by adding $\tfrac{1}{3}*Sq(3\omega)$ to both sides of expression (1), the term "$-\tfrac{1}{3}*\cos(3\omega t)$" in expression (1) is removed as shown in expression (3) as follows:

$$Sq(\omega)+\tfrac{1}{3}*Sq(3\omega)=(2/pi)*[\cos(\omega t)+\tfrac{1}{5}*\cos(5\omega t)+\ldots] \quad (3)$$

As such, it can be seen that adding or subtracting a first output signal generated from mixture of $Sq(\omega)$ with a baseband signal to a second output signal generated from mixture of $1/n$ $Sq(n\omega)$ may substantially remove an nth order harmonic in the first output signal arising from the term "$-1/n*\cos(n\omega t)$" in $Sq(\omega)$. While expressions (2) and (3) are directed to specific examples of removing third order harmonics arising from the term "$-\tfrac{1}{3}*\cos(3\omega t)$", additional implementations may be directed to removing fifth order harmonics arising from the term "$\tfrac{1}{5}*\cos(5\omega t)$" with subtraction of $\tfrac{1}{5}Sq(\omega)$ from $Sq(\omega w)$. Likewise, other nth order harmonics arising from other terms may be removed with combining $Sq(\omega)$ with $1/n$ $Sq(n\omega t)$.

Figure 2:
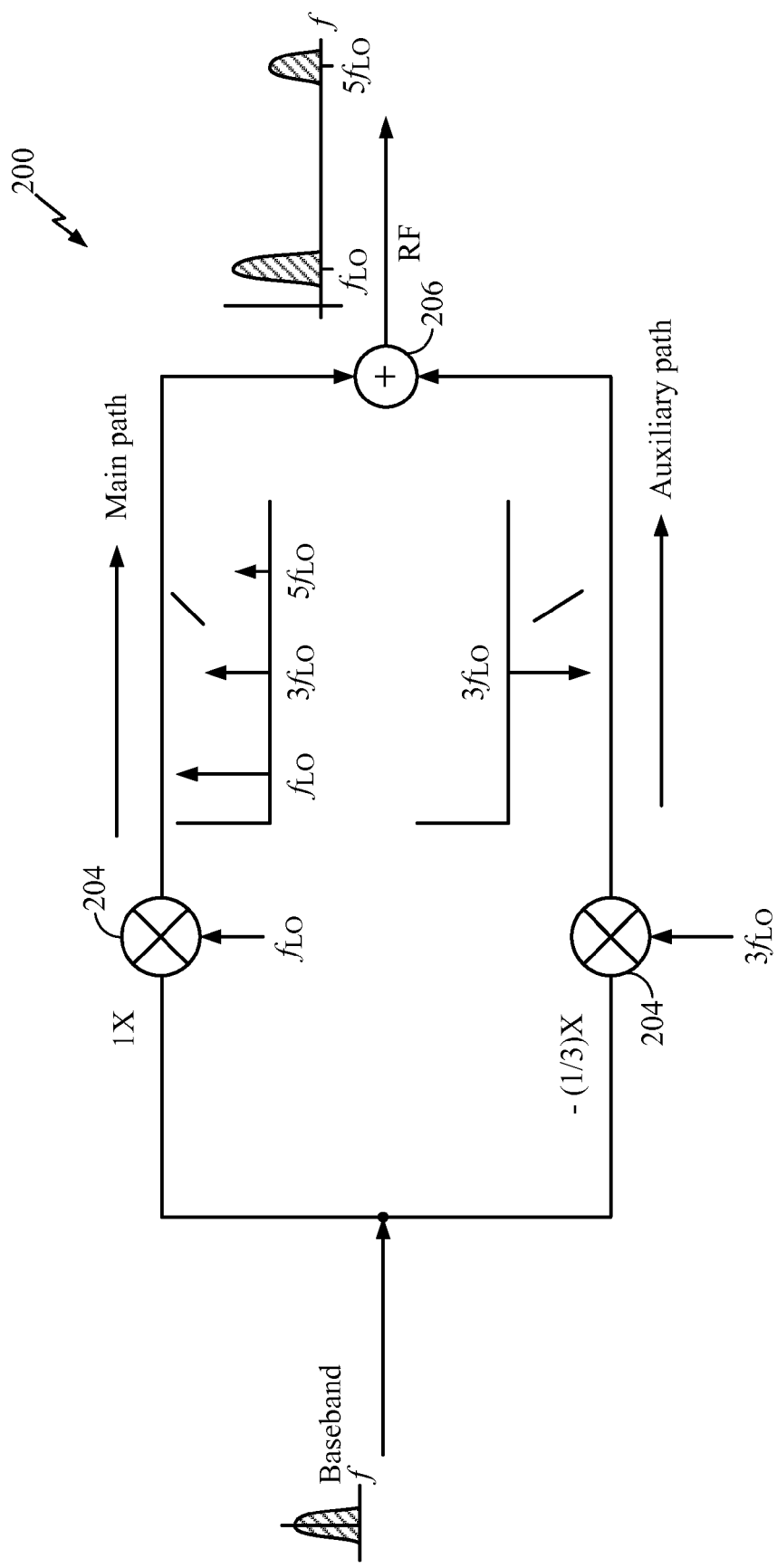
FIG. 2 is a schematic diagram of a circuit for processing a baseband signal for RF transmission using harmonic rejection circuit according to an implementation.

FIG. 2 is a schematic diagram of a system 200 for realizing a process of substantially cancelling nth order harmonics arising from the term "$-\tfrac{1}{3}*\cos(3\omega t)$" according to a particular implementation as explained with reference to expressions (1), (2) and (3) above. In one particular implementation, system 200 may be applicable for removal and/or suppression of third order harmonics arising from the term "$-\tfrac{1}{3}*\cos(3\omega t)$" in a single in-phase or quadrature channel. Accordingly, in some implementations, one system 200 may be applicable to an in-phase channel and another system 200 may be applicable to a quadrature channel. For simplicity, only one system 200 is being shown with the understanding that the following discussion regarding system 200 may apply to either an implementation for processing an in-phase channel or a quadrature channel. The output signal of summer 206 for an in-phase component may be combined with an output signal of a corresponding summer 206 for a quadrature channel for transmission as discussed above.

FIG. 2 shows a BB signal 208 being received at mixers 204 and 210. In a particular implementation, BB signal 208 may comprise a digital signal that has been filtered by a BB filter (e.g., a BB filter 102). In this particular example, BB signal 208 is mixed at mixer 204 in a main path with a first oscillation signal (e.g., a square wave) having at least a primary component at a frequency $f_{LO}$ for transmission at an RF frequency. As discussed above, BB signal 208 is also mixed with nth order harmonics of the first oscillation signal. Here, where the nth order harmonic of the first oscillation signal comprises a third order harmonic, the first oscillation signal may be expressed may be expressed in the frequency domain as $S(\omega)$ as shown in expression (1) above. BB signal 208 is also mixed at mixer 210 in an auxiliary path with a second oscillation signal (e.g., another square wave) having at least a primary frequency of about $n \times f_{LO}$ or ($3f_{LO}$) to provide a signal to be combined at summer 206 with the output of mixer 204 in the main path. Here, a gain of 1/n (or ⅓) is also applied to BB signal 208 in the auxiliary path. As can be observed, components arising from the nth or third order harmonics of the first local oscillation signal are substantially removed. In the particular implementation shown in FIG. 2, a desired signal at RF frequency $f_{LO}$ remains along with higher order harmonics (e.g., at $5 \times f_{LO}$ as shown). In particular applications, system performance may not be significantly degraded with the presence of such remaining higher order harmonics at low amplitudes.

As can be observed from the particular implementation of system 200 shown in FIG. 2, an nth order harmonic may be a particular in-phase or quadrature channel with implementation of merely a single additional mixer and phasor in the auxiliary path (or two additional mixers and two additional phasors for both in-phase and quadrature channels). As such, this particular approach may use less silicon and power, and generate less circuit noise than other HRM approaches.

Figure 3:
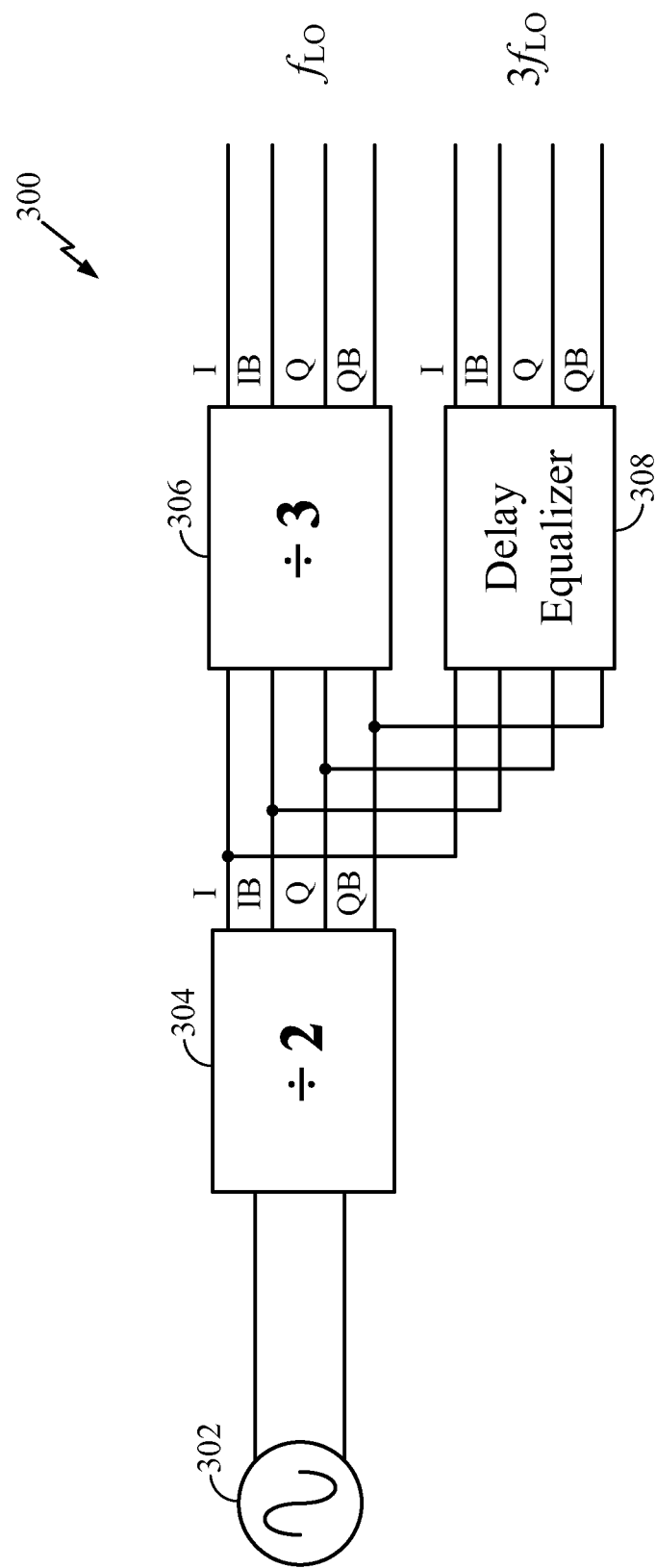
FIG. 3 is a schematic diagram of a circuit for generating local oscillation signals according to an implementation.

In the example of FIG. 2, a local oscillation signal is generated at a frequency $n \times f_{LO}$ (or $3f_{LO}$ as shown in the particular example) to be mixed with a filtered BB signal in an auxiliary path. In the particular implementation of applying removal and/or suppression of an nth order harmonic from both in-phase and quadrature channels, oscillation signals may be generated for both the in-phase and quadrature channels. Here, for example oscillating signals at frequencies $f_{LO}$ and $n \times f_{LO}$ may be generated for each of the in-phase and quadrature channels. FIG. 3 is a schematic diagram of a system 300 for generating such local oscillation signals for in-phase and quadrature channels at frequencies $f_{LO}$ and $n \times f_{LO}$ from a single voltage controlled oscillator (VCO) 302 according to an implementation. In the presently illustrated example, VCO 302 generates a sinusoid at an oscillation frequency of $6 \times f_{LO}$. In the particular implementation illustrated in FIG. 3, local oscillation signals may be generated as differential signals comprising a first signal pair I and IB to provide an in-phase oscillation signal and second signal pair Q and QB to provide a quadrature oscillation signal. Here, divider 304 may generate in-phase signal pair I and IB, and quadrature signal pair Q and QB as a square wave at a primary frequency $3 f_{LO}$. These oscillation signals are frequency divided again by divider 306 to generate components I, IB, Q and QB at frequency $f_{LO}$ to be mixed with a filtered BB signal in corresponding main paths of the in-phase and quadrature channels.

Components I, IB, Q and QB at frequency $3f_{LO}$ generated by divider 302 may be used to mix with a filtered BB signal in corresponding auxiliary paths of the in-phase and quadrature channels (e.g., for removing third order harmonics as discussed above). However, delay equalizer 308 may apply a delay to I, IB, Q and QB generated by divider 302 to be aligned with the phase of components I, IB, Q and QB at frequency $f_{LO}$ (e.g., to account for any delay introduced by divider 306).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method comprising:
    mixing a waveform component with a first oscillation signal generated via a first frequency divider and a second frequency divider to provide a first output signal, said first oscillation signal having at least a component at a frequency $f_{LO}$, said first output signal comprising an nth order harmonic;
    mixing said waveform component with a second oscillation signal generated via the first frequency divider and a delay equalizer and having at least a component at a frequency of an n multiple of $f_{LO}$ to provide a second output signal; and
    combining said first and second output signals to remove at least a portion of said nth order harmonic from said first output signal.

2. The method of claim 1, and further comprising:
    generating said waveform component by applying a digital baseband filter to a digital signal to provide a baseband filtered component at a baseband frequency $f_{BB}$, and wherein said nth order harmonic comprises at least a first signal component at frequencies of about $n \times f_{LO} +/- f_{BB}$.

3. The method of claim 2, wherein said nth order harmonic also comprises at least a second signal component of at frequency of about $n \times f_{LO} +/- n \times f_{BB}$.

4. The method of claim 1, and further comprising:
    applying the first frequency divider to an output signal of a voltage controlled oscillator to provide a first frequency divided output signal; and
    applying the second frequency divider to said first frequency divided output signal to provide a second frequency divided output signal,
    wherein mixing said waveform component with said first oscillation signal comprises mixing said waveform component with said second frequency divided output signal.

5. The method of claim 4, and further comprising:
    applying a delay to said first frequency divided output signal,
    wherein said mixing said waveform component with said second oscillation signal comprises mixing said waveform component with said delayed first frequency divided output signal.

6. The method of claim 5, wherein said delayed first frequency divided output signal is substantially phase aligned with said second frequency divided output signal.

7. The method of claim 1, and further comprising transmitting said combined first and second output signals at a radio frequency over a transmission medium.

8. The method of claim 1, and further comprising receiving said waveform component from a transmission medium at a radio frequency, and wherein said combined first and second output signals comprises a downconverted baseband signal.

9. The method of claim 8, and further comprising performing baseband processing on said down converted baseband signal.

10. The method of claim 1, and further comprising applying a gain of 1/n to said second output signal prior to said combining said second output signal with said first output signal.

11. The method of claim 1, wherein said nth order harmonic comprises a third order harmonic.

12. The method of claim 1, wherein said nth order harmonic comprises a fifth order harmonic.

13. The method of claim 1, wherein said nth order harmonic comprises an odd order harmonic.

14. An apparatus comprising:
    a first mixer to mix a waveform component with a first local oscillation signal generated via a first frequency divider and a second frequency divider to provide a first output signal, said first oscillation signal having at least a component at a frequency $f_{LO}$, said first output signal comprising an nth order harmonic;
    a second mixer to mix said waveform component with a second oscillation signal generated via the first frequency divider and a delay equalizer and having at least a component at an n multiple of $f_{LO}$ to provide a second output signal; and
    a summer to combine said first and second output signals to remove at least a portion of said nth order harmonic from said first output signal.

15. The apparatus of claim 14,
    the first frequency divider to provide a first frequency divided output signal from a voltage controlled oscillator; and
    the second frequency divider to provide a second frequency divided output signal from said first frequency divided output signal,
    wherein said first mixer is further to mix said waveform component with said second frequency divided output signal.

16. The apparatus of claim 14, and further comprising:
    a receiver to receive said waveform component from a transmission medium at a radio frequency, and wherein said combined first and second output signals comprises a downconverted baseband signal.

17. The apparatus of claim 14, and further comprising:
    a transmitter to transmit an output signal of said summer over a transmission medium.

18. An apparatus comprising:
means for mixing a waveform component with a first oscillation signal generated via a first frequency divider and a second frequency divider to provide a first output signal, said first oscillation signal having at least a component at a frequency $f_{LO}$, said first output signal comprising an nth order harmonic;
means for mixing said waveform component with a second oscillation signal generated via the first frequency divider and a delay equalizer and having at least a component at a frequency of an n multiple of $f_{LO}$ to provide a second output signal; and
means for combining said first and second output signals to remove at least a portion of said nth order harmonic from said first output signal.

19. The apparatus of claim 18, and further comprising:
means for generating said waveform component by applying a digital baseband filter to a digital signal to provide a baseband filtered component at a baseband frequency $f_{BB}$, and wherein said nth order harmonic comprises at least a first signal component at frequencies of about $n \times f_{LO} +/- f_{BB}$.

20. The apparatus of claim 19, wherein said nth order harmonic further comprises at least a second signal component at frequency of about $n \times f_{LO} +/- n \times f_{BB}$.

21. The apparatus of claim 18, and further comprising:
means for frequency dividing an output signal of a voltage controlled oscillator to provide a first frequency divided output signal; and
means for frequency dividing said first frequency divided output signal to provide a second frequency divided output signal,
wherein said means for mixing said waveform component with said first oscillation signal comprises means for mixing said waveform component with said second frequency divided output signal.

22. The apparatus of claim 21, and further comprising:
means for delaying said first frequency divided output signal,
wherein said means for mixing said waveform component with said second oscillation signal comprises means for mixing said waveform component with said delayed first frequency divided output signal, and wherein said delayed first frequency divided output signal is substantially phase aligned with said second frequency divided output signal.

23. The apparatus of claim 18, and further comprising means for applying a gain of 1/n to said second output signal prior to said combining said second output signal with said first output signal.

* * * * *